US010444610B2

(12) United States Patent
Xu (10) Patent No.: US 10,444,610 B2
(45) Date of Patent: *Oct. 15, 2019

(54) SYSTEMS, DEVICES, AND METHODS FOR LASER PROJECTORS (71) Applicant: North Inc., Ontario (CA)

(72) Inventor: Kai Xu, Mississauga (CA)

(73) Assignee: North Inc., Kitchener, ON (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/047,859

(22) Filed: Jul. 27, 2018

(65) Prior Publication Data
US 2019/0033585 A1 Jan. 31, 2019

Related U.S. Application Data (60) Provisional application No. 62/537,737, filed on Jul. 27, 2017.

(51) Int. Cl.
G02B 27/01 (2006.01)
G03B 21/00 (2006.01)
(Continued)

(52) U.S. Cl.
CPC ..... *G03B 21/2033* (2013.01); *G02B 27/0101* (2013.01); *G02B 27/1006* (2013.01);
(Continued)

(58) Field of Classification Search
CPC ............ G03B 21/2013; G03B 21/2033; G03B 21/204; G03B 21/2053; G03B 21/2086; H04N 9/3123; H04N 9/3129; H04N 9/3135; H04N 9/3155; H04N 9/3158; H04N 9/3161; H04N 9/3164; H04N 9/3182; H04N 9/3194; G09G 2330/02; G09G 2330/12; G09G 2330/021; G09G 5/10; G09G 3/025; G02B 27/0172; G02B 27/017;
(Continued)

(56) References Cited

U.S. PATENT DOCUMENTS

2006/0291510 A1* 12/2006 Juluri ................... H01S 5/0683 372/29.021
2007/0285625 A1* 12/2007 Yavid ................... G02B 26/101 353/85
(Continued)

Primary Examiner — Christina A Riddle
Assistant Examiner — Christopher A Lamb, II
(74) Attorney, Agent, or Firm — Thomas Mahon (57) ABSTRACT Laser safety systems, devices, and methods for use in laser projectors are described. A laser projector includes any number of laser diodes that each emit laser light, a laser diode power source, a current sensor to detect a magnitude of the electric current output by the power source, a photodetector to detect a power/intensity of the laser light, a beam splitter to direct a first portion of the light towards the photodetector and a second portion of the light towards an output on the projector, and first and second laser safety circuits responsive to signals from the photodetector and the current sensor, respectively. The laser safety circuits selectively electrically couples/uncouples the laser diodes from the power source depending on signals from the photodetector and/or the current sensor. Particular applications of the laser safety systems, devices, and methods in a wearable heads-up display are described.

11 Claims, 6 Drawing Sheets (51) Int. Cl.
  *G03B 21/20*      (2006.01)
  *H01S 5/026*      (2006.01)
  *G02B 27/10*      (2006.01)
  *H01L 25/16*      (2006.01)
  *H01S 5/062*      (2006.01)
  *H04B 10/50*      (2013.01)
  *H04B 10/69*      (2013.01)
  *H04N 9/31*       (2006.01)
  *H01S 5/068*      (2006.01)
  *H01S 5/40*       (2006.01)
  *H01S 5/00*       (2006.01)
  *H01S 5/042*      (2006.01)
  *H01S 5/0683*     (2006.01)

(52) U.S. Cl.
  CPC ....... *G03B 21/005* (2013.01); *G03B 21/2086* (2013.01); *H01L 25/167* (2013.01); *H01S 5/0264* (2013.01); *H01S 5/062* (2013.01); *H01S 5/06825* (2013.01); *H04B 10/502* (2013.01); *H04B 10/691* (2013.01); *H04N 9/3155* (2013.01); *H04N 9/3161* (2013.01); *H04N 9/3194* (2013.01); *G02B 27/017* (2013.01); *G02B 2027/0178* (2013.01); *H01S 5/0071* (2013.01); *H01S 5/0427* (2013.01); *H01S 5/06832* (2013.01); *H01S 5/4012* (2013.01); *H01S 5/4093* (2013.01)

(58) Field of Classification Search
  CPC ............ G02B 27/0093; G02B 27/0101; G02B 27/0176; G02B 27/0103; G02B 27/0081; G02B 27/01; G02B 27/0179; G02B 27/0025; G02B 27/0075; G02B 27/0037; G02B 27/0087; G02B 27/22; G02B 27/14; G02B 27/0905; G02B 27/2242; G02B 27/225; G02B 27/2264; G02B 27/26; G02B 27/285; G02B 27/30; G02B 27/4227; G02B 27/58; G02B 2027/0178; G02B 2027/014; G02B 2027/0174; G02B 2027/0187; G02B 2027/0118; G02B 2027/0123; G02B 2027/0125; G02B 2027/015; G02B 2027/0138; G02B 2027/0112; G02B 2027/0109; G02B 2027/0107; G02B 2027/011; G02B 2027/0127; G02B 2027/0132; G02B 2027/0134; G02B 2027/0116; G02B 2027/012; G02B 2027/0136; G02B 2027/0141; G02B 2027/0147; G02B 2027/0154; G02B 2027/0163; G02B 5/32; G02B 5/30; G02B 5/005; G02B 5/18; G02B 5/1814; G02B 5/1828; G02B 5/188; G02B 5/189; G02B 5/20; G02B 26/10; G02B 26/101; G02B 26/0833; G02B 26/0808; G02B 26/0816; G02B 26/105; G02B 26/02; G02B 26/06; G02B 26/0858; G02B 26/12; G02B 6/00; G02B 6/0016; G02B 6/0028; G02B 6/0035; G02B 6/0078; G02B 6/02042; G02B 6/06; G02B 6/32; G02B 6/34; G02B 6/40; G02B 3/0037; G06F 3/013; G06F 3/011; G06F 3/017; G06F 3/015; G06F 3/014; G06F 3/016; G06F 3/0484; G06F 3/04842; G06F 3/005; G06F 3/0383; G06F 3/0482; G06F 3/0487; G06F 3/04883; G06F 3/1454; G06F 3/012; G06F 3/02; G06F 3/0227; G06F 3/0233; G06F 3/0304; G06F 3/0325; G06F 3/048; G06F 3/04817; G06F 3/04847; G06F 3/147; G06F 1/1613; G06F 1/1643; G06F 1/163; G06F 2203/011; G06F 2203/0331; G06F 2203/0381; G06F 2203/0384; G06F 17/30867; H01S 5/06825; H01S 5/0683
  See application file for complete search history.

(56) References Cited

U.S. PATENT DOCUMENTS

| | | | |
|---|---|---|---|
| 2010/0053729 A1* | 3/2010 | Tilleman | G02B 6/14 359/298 |
| 2012/0320103 A1* | 12/2012 | Jesme | G09G 3/3413 345/690 |
| 2013/0003026 A1* | 1/2013 | Rothaar | G03B 21/2033 353/85 |
| 2016/0081171 A1* | 3/2016 | Ichikawa | B60Q 1/0088 315/77 |
| 2019/0033698 A1 | 1/2019 | Xu | |
| 2019/0037183 A1 | 1/2019 | Xu | |

* cited by examiner

SYSTEMS, DEVICES, AND METHODS FOR LASER PROJECTORS

TECHNICAL FIELD

The present systems, devices, and methods generally relate to laser projectors and particularly relate to the safety of laser projectors.

BACKGROUND

Description of the Related Art

Laser Projectors

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional scanning laser projectors, the at least one controllable mirror may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

Laser Safety

Malfunction or improper use of laser devices can result in temporary or permanent damage to the eye; therefore, laser safety precautions are essential. Safety measurements for lasers and laser devices include: the maximum permissible exposure (MPE) (i.e., the maximum amount of user exposure before damage occurs), and the accessible emission limit (AEL) (i.e., the emitted power of the laser that is accessible in use). MPE is measured as power density ($W/cm^2$ or $J/cm^2$) and AEL is measured as power (W or J) or power density ($W/cm^2$ or $J/cm^2$) depending on the specific laser wavelength.

Wearable Heads-Up Displays

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. Examples of wearable heads-up displays include: the Google Glass®, the Optinvent Ora®, the Epson Moverio®, and the Sony Glasstron®, just to name a few.

The optical performance of a wearable heads-up display is an important factor in its design. When it comes to face-worn devices, however, users also care a lot about aesthetics. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal. Most wearable heads-up displays presented to date employ large display components and, as a result, most wearable heads-up displays presented to date are considerably bulkier and less stylish than conventional eyeglass frames.

A challenge in the design of wearable heads-up displays is to minimize the bulk of the face-worn apparatus while still providing displayed content with sufficient visual quality. There is a need in the art for wearable heads-up displays of more aesthetically-appealing design that are capable of safely providing high-quality images to the user without introducing unreasonable risk to the user's eye(s).

BRIEF SUMMARY

A laser projector may be summarized as including: at least one laser diode; a photodetector responsive to laser light output by the at least one laser diode; a current sensor responsive to electric current output by a power source; a beam splitter positioned and oriented to direct a first portion of laser light from the at least one laser diode along a first optical path towards the photodetector and a second portion of laser light from the at least one laser diode along a second optical path towards an output of the laser projector; a first laser safety circuit communicatively coupled to the photodetector and responsive to signals therefrom, the first laser safety circuit comprising a first switch that mediates an electrical coupling between the power source and the at least one laser diode, wherein in response to a signal from the photodetector indicative that a power of the laser light output by the at least one laser diode exceeds a first threshold, the first switch interrupts a supply of power to the at least one laser diode from the power source; and a second laser safety circuit communicatively coupled to the current sensor and responsive to signals therefrom, the second laser safety circuit comprising a second switch that mediates electrical coupling between the power source and the at least one laser diode, wherein in response to a signal from the current sensor indicative that an electric current output by the power source exceeds a second threshold, the switch interrupts a supply of power to the at least one laser diode from the power source. The laser projector optionally includes the power source, or the power source is supplied separately therefrom, for example by a consumer or end user of the laser projector.

The first laser safety circuit may further include a first latch that is communicatively coupled to the photodetector and to the first switch, wherein: a state of the first latch is responsive to signals from the photodetector and the first switch is responsive to the state of the first latch; the state of the first latch changes from a first state to a second state in response to the signal from the photodetector indicative that the power of the laser light output by the at least one laser diode exceeds the first threshold; and the first switch interrupts the supply of power to the at least one laser diode from the power source in response to the state of the first latch changing from the first state to the second state. The first latch may be operable to store a current state selected from the first state and the second state and maintain the current state during a reboot event. The laser projector may further include: a processor communicatively coupled to the at least one laser diode and to the first latch, the processor to modulate the at least one laser diode, wherein, in response to the latch being in the second state, the processor stops modulating the at least one laser diode and prevents further modulations of the at least one laser diode. The laser projector may further include a non-transitory processor-readable storage medium communicatively coupled to the processor, wherein: in response to the first latch being in the second state, the processor stores a flag in the non-transitory processor-readable storage medium; and upon boot-up of the laser projector, the processor accesses the non-transitory processor-readable storage medium to check for the flag, wherein in response to the processor finding the flag stored in the non-transitory processor-readable storage medium the processor prevents modulations of the at least one laser diode.

The second laser safety circuit may further include a second latch that is communicatively coupled to the current sensor and to the second switch, wherein: a state of the second latch is responsive to signals from the current sensor and the second switch is responsive to the state of the second latch; the state of the second latch changes from a first state to a second state in response to the signal from the current sensor indicative that the electric current output by the power source exceeds the second threshold; and the second switch interrupts the supply of power to the at least one laser diode from the power source in response to the state of the first latch changing from the first state to the second state. The second latch may be operable to store a current state selected from the first state and the second state and maintain the current state during a reboot event. The laser projector may further include: a processor communicatively coupled to the at least one laser diode and to the second latch, the processor to modulate the at least one laser diode, wherein, in response to the second latch being in the second state, the processor stops modulating the at least one laser diode and prevents further modulations of the at least one laser diode. The laser projector may further comprise a non-transitory processor-readable storage medium communicatively coupled to the processor, wherein: in response to second latch being in the second state the processor stores a flag in the non-transitory processor-readable storage medium; and upon boot-up of the laser projector, the processor accesses the non-transitory processor-readable storage medium to check for the flag, wherein in response to the processor finding the flag stored in the non-transitory processor-readable storage medium the processor prevents modulations of the at least one laser diode. The laser projector may further include: a digital potentiometer to set the second threshold; and a comparator communicatively coupled to the digital potentiometer and communicatively coupled in between the current sensor and the latch, the comparator to compare signals from the current sensor to the second threshold set by the digital potentiometer and to control the state of the latch based on a comparison between at least one signal from the current sensor and the second threshold set by the digital potentiometer.

The second laser safety circuit of the laser projector may further include a digital potentiometer to set the second threshold.

A method of operating a laser projector comprising a power source, at least one laser diode, a beam splitter, a photodetector, a current sensor, and a first laser safety circuit and a second laser safety circuit which operate simultaneously, may be summarized as including: providing power to the at least one laser diode by the power source electrically coupled to the at least one laser diode; generating a laser light by the at least one laser diode; splitting the laser light into a first portion and a second portion by the beam splitter; directing the first portion of the laser light from the at least one laser diode along a first optical path towards a photodetector by the beam splitter; directing the second portion of the laser light from the at least one laser diode along a second optical path towards an output of the laser projector by the beam splitter; detecting the first portion of the laser light by the photodetector; outputting a first signal by the photodetector in response to detecting the first portion of the laser light by the photodetector, the first signal indicative of a power of the laser light generated by the at least one laser diode; receiving the first signal from the photodetector by the first laser safety circuit communicatively coupled to the photodetector, wherein the first laser safety circuit includes a first switch that mediates the electrical coupling between the power source and the at least one laser diode; and in response to the first signal from the photodetector indicating that the power of the laser light generated by the at least one laser diode exceeds a first threshold, interrupting, by the first switch, a supply of power to the at least one laser diode from the power source; and detecting the electric current output of the power source by the current sensor; outputting a second signal indicative of the electric current output of the power source by the current sensor, receiving the second signal from the current sensor by the second laser safety circuit communicatively coupled to the current sensor, wherein the second laser safety circuit includes a second switch that mediates the electrical coupling between the power source and the at least one laser diode; and in response to the second signal from the current sensor indicating that electric current output of the power source exceeds a second threshold, interrupting, by the second switch, a supply of power to the at least one laser diode from the power source.

The first laser safety circuit may include a first latch that is communicatively coupled to the photodetector and to the first switch, wherein a state of the first latch is responsive to the signal from the photodetector and the first switch responsive to the state of the first latch, and the method may further include: in response to the signal from the photodetector indicating that the power of the laser light output by the at least one laser diode exceeds the first threshold, changing, by the first latch, the state of the first latch from a first state to a second state; and wherein interrupting, by the first switch, a supply of power to the at least one laser diode from the power source includes interrupting, by the first switch, a supply of power to the at least one laser diode from the power source in response to the state of the first latch changing from the first state to the second state. The method may further include: storing a current state of the first latch; and maintaining the current state of the first latch during a reboot event.

The laser projector may include a processor, wherein the processor is communicatively coupled to the first latch, and wherein generating a laser light by the at least one laser diode includes modulating the at least one laser diode by the processor, and the method may further include: in response to the state of the first latch indicating that the power of the laser light generated by the at least one laser diode exceeds the first threshold: stopping modulation of the at least one laser diode by the processor; and preventing further modulations of the at least one laser diode by the processor. The laser projector may include a non-transitory processor-readable storage medium communicatively coupled to the processor, and the method may further include: in response to the state of the first latch indicating that the power of the laser light generated by the at least one laser diode exceeds the first threshold, storing, by the processor, a flag in the non-transitory processor-readable storage medium; and upon boot-up of the laser projector, checking for the flag stored in the non-transitory processor-readable storage medium by the processor and, in response to finding the flag stored in the non-transitory processor-readable storage medium by the processor, preventing modulations of the at least one laser diode by the processor.

The second laser safety circuit may include a second latch that is communicatively coupled to the current sensor and to the second switch, wherein a state of the second latch is responsive to the signal from the current sensor and the second switch responsive to the state of the second latch, and wherein the method further includes: in response to the signal from the current sensor indicating that the electric current output by the power source exceeds the second threshold, changing, by the second latch, the state of the second latch from a first state to a second state; and wherein interrupting, by the second switch, a supply of power to the at least one laser diode from the power source includes interrupting, by the second switch, a supply of power to the at least one laser diode from the power source in response to the state of the second latch changing from the first state to the second state. The method may further include: storing a current state of the second latch; and maintaining the current state of the second latch during a reboot event. The laser projector may include a processor, the processor communicatively coupled to the second latch, wherein generating a laser light by the at least one laser diode includes modulating the at least one laser diode by the processor, and the method further including: in response to the state of the second latch indicating that the electric current output of the power source exceeds the second threshold: stopping modulation of the at least one laser diode by the processor; and preventing further modulations of the at least one laser diode by the processor. The laser projector may include a non-transitory processor-readable storage medium communicatively coupled to the processor, and the method may further include: in response to the state of the second latch indicating that the electric current output of the power source exceeds the second threshold, storing, by the processor, a flag in the non-transitory processor-readable storage medium; and upon boot-up of the laser projector, checking for the flag stored in the non-transitory processor-readable storage medium by the processor and, in response to finding the flag stored in the non-transitory processor-readable storage medium by the processor, preventing modulations of the at least one laser diode by the processor.

The laser projector may further include a digital potentiometer, and the method may further include setting the second threshold by the digital potentiometer.

A wearable heads-up display ("WHUD") may be summarized as including: a support structure that in use is worn on the head of a user; a transparent combiner carried by the support structure and positioned in a field of view of at least one eye of the user when the support structure is worn on the head of the user; and a laser projector carried by the support structure and positioned and oriented to direct laser light towards the transparent combiner, the laser projector comprising: at least one laser diode; a power source; a photodetector responsive to laser light output by the at least one laser diode; a current sensor responsive to electric current output by the power source; a beam splitter positioned and oriented to direct a first portion of laser light from the at least one laser diode along a first optical path towards the photodetector and a second portion of laser light from the at least one laser diode along a second optical path towards an output of the laser projector; a first laser safety circuit communicatively coupled to the photodetector and responsive to signals therefrom, the first laser safety circuit comprising a first switch that mediates an electrical coupling between the power source and the at least one laser diode, wherein in response to a signal from the photodetector indicative that a power of the laser light output by the at least one laser diode exceeds a first threshold, the first switch interrupts a supply of power to the at least one laser diode from the power source; and a second laser safety circuit communicatively coupled to the current sensor and responsive to signals therefrom, the second laser safety circuit comprising a second switch that mediates an electrical coupling between the power source and the at least one laser diode, wherein, in response to a signal from the current sensor indicative that an electric current output of the power source exceeds a second threshold, the second switch interrupts a supply of power to the at least one laser diode from the power source.

The first laser safety circuit of the laser projector may further include a first latch that is communicatively coupled to the photodetector and to the first switch, wherein: a state of the first latch is responsive to signals from the photodetector and the first switch is responsive to the state of the first latch; the state of the first latch changes from a first state to a second state in response to the signal from the photodetector indicative that the power of the laser light output by the at least one laser diode exceeds the first threshold; and the first switch interrupts the supply of power to the at least one laser diode in response to the state of the first latch changing from the first state to the second state. The first latch may be operable to store a current state selected from the first state and the second state and maintain the current state during a reboot event. The WHUD may further include a processor communicatively coupled to the at least one laser diode and to the first latch, the processor to modulate the at least one laser diode, wherein, in response to the latch being in the second state, the processor stops modulating the at least one laser diode and prevents further modulations of the at least one laser diode. The WHUD may further include a non-transitory processor-readable storage medium communicatively coupled to the processor, wherein: in response to the first latch being in the second state, the processor stores a flag in the non-transitory processor-readable storage medium; and upon boot-up of the laser projector, the processor accesses the non-transitory processor-readable storage medium to check for the flag, wherein in response to the processor finding the flag stored in the non-transitory processor-readable storage medium the processor prevents modulations of the at least one laser diode.

The second laser safety circuit may further include a second latch that is communicatively coupled to the current sensor and to the second switch, and wherein: a state of the second latch is responsive to signals from the current sensor and the second switch is responsive to the state of the second latch; the state of the second latch changes from a first state to a second state in response to the signal from the current sensor indicative that the electric current output by the power source exceeds the second threshold; and the second switch interrupts the supply of power to the at least one laser diode from the power source in response to the state of the first latch changing from the first state to the second state. The second latch may be operable to store a current state selected from the first state and the second state and maintain the current state during a reboot event. The WHUD may further include a processor communicatively coupled to the at least one laser diode and to the second latch, the processor to modulate the at least one laser diode, wherein, in response to the second latch being in the second state, the processor stops modulating the at least one laser diode and prevents further modulations of the at least one laser diode. The WHUD may further include a non-transitory processor-readable storage medium communicatively coupled to the processor, wherein: in response to second latch being in the second state the processor stores a flag in the non-transitory processor-readable storage medium; and upon boot-up of the laser projector, the processor accesses the non-transitory processor-readable storage medium to check for the flag, wherein in response to the processor finding the flag stored in the non-transitory processor-readable storage medium the processor prevents modulations of the at least one laser diode. The second laser safety circuit of the WHUD may further include a digital potentiometer to set the second threshold; and a comparator communicatively coupled to the digital potentiometer and communicatively coupled in between the current sensor and the latch, the comparator to compare signals from the current sensor to the second threshold set by the digital potentiometer and to control the state of the latch based on a comparison between at least one signal from the current sensor and the second threshold set by the digital potentiometer. The second laser safety circuit of the WHUD may further include a digital potentiometer to set the second threshold.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

The various embodiments described herein provide systems, devices, and methods for safe operation of a laser projector and are particularly well-suited for use in near eye displays (e.g., wearable heads-up displays ("WHUDs")) that employ laser projectors.

Figure 1:
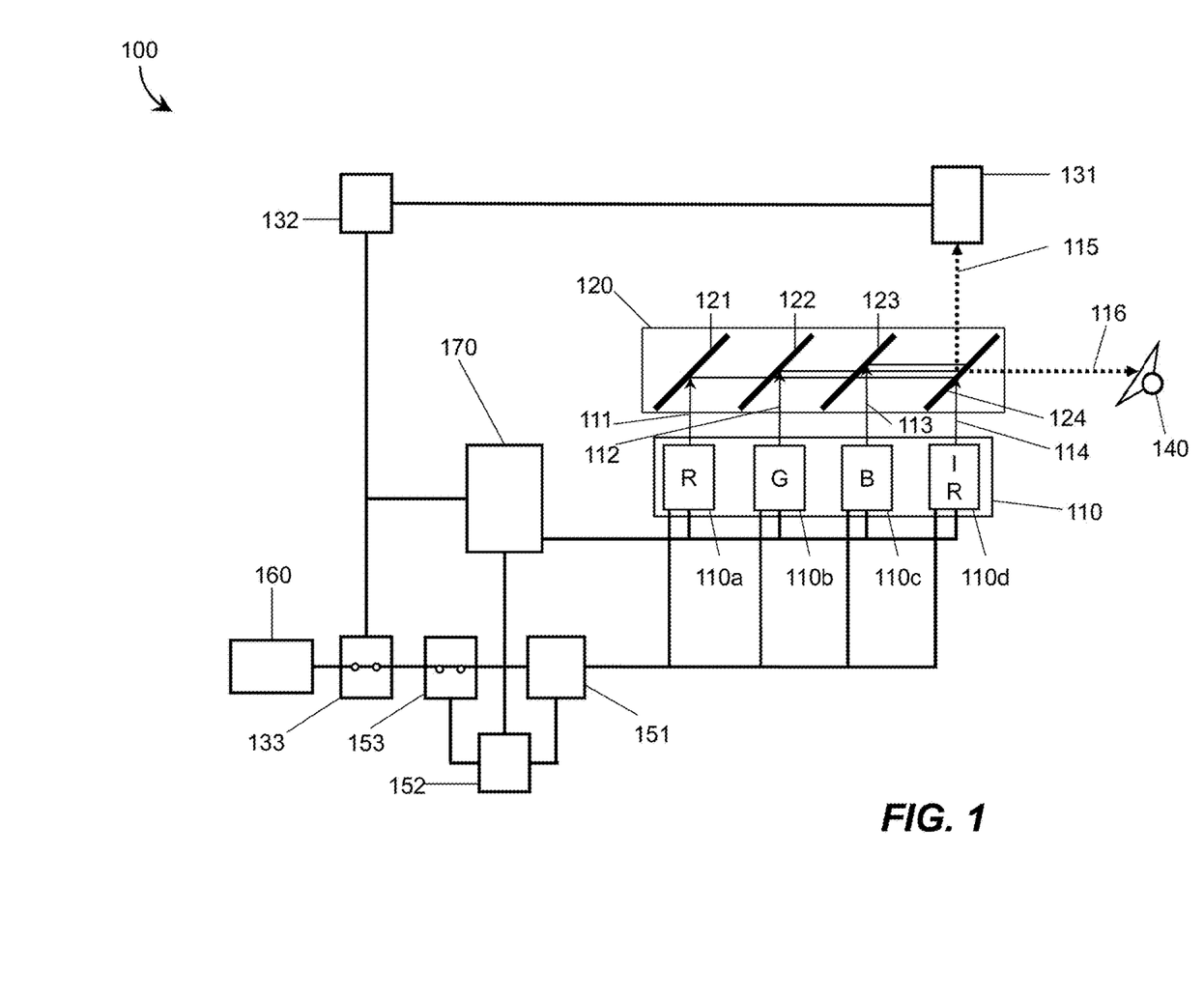
FIG. 1 is a schematic diagram of a laser projector with a first laser safety circuit and a second laser safety circuit in accordance with the present systems, devices, and methods.

FIG. 1 is a schematic diagram of a laser projector 100 with a first laser safety circuit and a second laser safety circuit in accordance with the present systems, devices, and methods. Laser projector 100 comprises, for example, four laser diodes 110a, 110b, 110c, 110d (collectively 110), a beam combiner 120, a photodetector 131 responsive to light emitted by each of laser diodes 110, at least one scan mirror 140, a current sensor 151, a laser diode power source 160 electrically coupled to laser diodes 110, and a processor 170 communicatively coupled to both laser diodes 110 and photodetector 131. The first laser safety circuit of laser projector 100 includes a first latch (e.g., "flip-flop") 132 communicatively coupled to photodetector 131 and a first switch 133 that is communicatively coupled to latch 132 and electrically coupled in between power source 160 and laser diodes 110. The second laser safety circuit of laser projector 100 includes a second latch 152 that is communicatively coupled to current sensor 151 and a second switch 153 that is communicatively coupled to latch 153 and electrically coupled in between power source 160 and laser diodes 110. Processor 170 is communicatively coupled to both latch 132 and latch 153. Processor 170 (i.e., circuitry), can take the form of one or more of any of microprocessors, microcontrollers, application specific integrated circuits (ASICs), digital signal processors (DSPs), programmable gate arrays (PGAs), and/or programmable logic controllers (PLCs), or any other integrated or non-integrated circuit that perform logic operations).

Throughout this specification and the appended claims, the terms "electrical coupling" and "communicative coupling" (and variants, such as "electrically coupled" and "communicatively coupled") are often used. Generally, "electrical coupling" refers to any engineered arrangement for coupling electrical signals between one or more electrical signal carrier(s) (e.g., conductor(s) or semiconductor(s)) and includes without limitation galvanic coupling, inductive coupling, magnetic coupling, and/or capacitive coupling for the purpose of transferring, for example, electrical data signals, electrical information, and/or electrical power. Electrical coupling is a form of communicative coupling. "Communicative coupling" refers to any engineered arrangement for transferring signals (e.g., electrical or otherwise) for the purpose of transferring data, information, and/or power and includes, at least, electrical coupling (e.g., via electrically conductive wires, electrically conductive traces), magnetic coupling (e.g., via magnetic media), and/or optical coupling (e.g., via optical fiber).

In brief, the first laser safety circuit of projector 100 operates as follows. Signals output by photodetector 131 control a state of latch 132 and the state of latch 132 controls a state of switch 133. Switch 133 is controllably switchable into and between a first state or configuration in which electrical coupling between power source 160 and laser diodes 110 is enabled by or through switch 133 and a second state or configuration in which electrical coupling between power source 160 and laser diodes 110 is disabled by or through switch 133. Laser diodes 110 consist of a first red laser diode (R), a second green laser diode (G), a third blue laser diode (B), and a fourth infrared laser diode (IR). All four laser diodes 110 are selectively electrically coupleable to power source 160 by or through at least one switch 133 and are communicatively coupled to the processor 170 that controls the operation (e.g., modulation) thereof. The first laser diode 110a emits a first (e.g., red) light signal 111, the second laser diode 110b emits a second (e.g., green) light signal 112, the third laser diode 110c emits a third (e.g., blue) light signal 113, and the fourth laser diode 110d emits a fourth (e.g., infrared) light signal 114. All four of light signals 111, 112, 113, and 114 enter or impinge on beam combiner 120 comprising optical elements 121, 122, 123, and 124. First light signal 111 is emitted towards first optical element 121 and reflected by first optical element 121 of beam combiner 120 towards second optical element 122 of beam combiner 120. Second light signal 112 is also directed towards second optical element 122. Second optical element 122 is formed of a dichroic material that is transmissive of the red wavelength of first light signal 111 and reflective of the green wavelength of second light signal 112; therefore, second optical element 122 transmits first light signal 111 and reflects second light signal 112. Second optical element 122 combines first light signal 111 and second light signal 112 into a single aggregate beam (shown as separate beams for illustrative purposes) and routes the aggregate beam towards third optical element 123 of beam combiner 120. Third light signal 113 is also routed towards third optical element 123. Third optical element 123 is formed of a dichroic material that is transmissive of the wavelengths of light (e.g., red and green) in the aggregate beam comprising first light signal 111 and second light signal 112 and reflective of the blue wavelength of third light signal 113. Accordingly, third optical element 123 transmits the aggregate beam comprising first light signal 111 and second light signal 112 and reflects third light signal 113. In this way, third optical element 123 adds third light signal 113 to the aggregate beam such that the aggregate beam comprises light signals 111, 112, and 113 (shown as separate beams for illustrative purposes) and routes the aggregate beam towards fourth optical element 124 in beam combiner 120. Fourth light signal 114 is also routed towards fourth optical element 124. Fourth optical element 124 is formed of a dichroic material that is partially transmissive of the visible wavelengths of light (e.g., red, green, and blue) in the aggregate beam comprising first light signal 111, second light signal 112, and third light signal 113 and partially reflective of the infrared wavelength of fourth light signal 114. Accordingly, fourth optical element 124 partially transmits the aggregate beam comprising first light signal 111, second light signal 112, and third light signal 113 and partially reflects fourth light signal 114. In this way, fourth optical element 124 adds at least a portion of fourth light signal 114 to the aggregate beam such that the aggregate beam comprises portions of light signals 111, 112, 113, and 114 and routes at least a portion of the aggregate beam towards scan mirror 140 and the output of projector 100.

In the exemplary implementation of projector 100, fourth optical element 124 is a dual-purpose optical component. In addition to functioning as the last optical combining element in optical combiner 120 (i.e., by combining fourth, infrared laser light 114 with the red, green, and blue laser light 111, 112, and 113, respectively), fourth optical element 124 also functions as a beam splitter in projector 100. To this end, fourth optical element 124 is positioned and oriented to direct a first portion 115 of the aggregate laser light (represented by a dashed arrow in FIG. 1) from laser diodes 110 (i.e., comprising first light 111, second light 112, third light 113, and fourth light 114) towards photodetector 130 and a second portion 116 of the aggregate laser light (also represented by a dashed arrow in FIG. 1) towards scan mirror 140 and an output of laser projector 100. In the implementation of FIG. 1, scan mirror 140 scans (e.g., raster scans) second portion 116 of the aggregate laser beam to output a projected display or illumination pattern. In the implementation of a wearable heads-up display, scan mirror 140 may direct the visible light to create display content in the field of view of a user, and may direct the infrared light to illuminate the eye of the user for the purpose of eye tracking. A person of skill in the art will appreciate that the visible and infrared light may take different paths before or beyond the scan mirror. A person of skill in the art will also appreciate that methods other than a scan mirror, such as beam steering and/or one or more digital light processor(s), can be employed to create display content or to direct the infrared light.

Photodetector 131 is responsive to first portion 115 of the aggregate laser beam and, in response to detecting first portion 115 of the aggregate laser beam, outputs a signal indicative of, based on, dependent on, or generally representative of the power or intensity of first portion 115 of the aggregate laser beam. In an implementation with multiple laser sources (e.g., multiple laser diodes 110), each laser source emitting light of a different wavelength or a different range of wavelengths (e.g., laser light signals 111, 112, 113, and 114), photodetector 131 is responsive to light within one or more waveband(s) that, in total (e.g., collectively in combination) includes all of the emitted wavelengths. Latch 132 is communicatively coupled to photodetector 131 and has a state that is responsive to signals therefrom. If and/or when a signal from photodetector 131 is below a first threshold, latch 132 is in a first state; if and/or when a signal from photodetector 131 is above a first threshold, latch 132 is in a second state. Latch 132 may be operable to store and maintain (i.e., keep or reload) its current state if a reboot event occurs. For example, if a signal indicative of laser light that exceeds the first threshold caused latch 132 to be in the second state, the latch would still be in the second state following a reboot event unless the latch is positively cleared, via a separate action by the user that is not part of an automated or autonomous process of rebooting. Switch 122 is communicatively coupled to and responsive to the state of latch 132. A signal that indicates the state of latch 132 is received by switch 133 from latch 132. Switch 133 is selectively electrically coupleable between power source 160 and laser diodes 110. Switch 133 controllably/selectively enables or disables electrical coupling between power source 160 and laser diodes 110 in response to the state of latch 132. In other words, depending on the state of latch 132 (which itself depends on a magnitude of a signal output by photodetector 131, representative of a magnitude of the power or intensity of first portion 115 of the aggregate laser beam in projector 100), switch 133 selectively provides or blocks (e.g., interrupts) electrical power to laser diodes 110 from power source 160.

The second laser safety circuit of laser projector 100 operates as follows. Power source 160 generates an electric current. Current sensor 151 is responsive to the electric current output by power source 160 and outputs a signal indicative of, based on, or generally representative of the magnitude of the output current. Latch 152 is communicatively coupled to current sensor 151 and has a state that is responsive to signals therefrom. If and/or when a signal from current sensor 151 is below a second threshold, latch 152 is in a first state; if and/or when a signal from current sensor 151 is above the second threshold, latch 152 is in a second state. Latch 152 may be operable to store and maintain (i.e., keep or reload) its current state if a reboot event occurs. Switch 153 is communicatively coupled to latch 152 and responsive to the state of latch 152. Switch 153 is electrically coupleable between power source 160 and lasers diodes 110. Switch 153 controllably/selectively enables or disables electrical coupling between power source 160 and one or more of laser diodes 110 in response to the state of latch 152. That is, when latch 152 is in the first configuration switch 153 enables electrical coupling between power source 160 and one or more of laser diodes 110, and when latch 152 is in the second configuration switch 153 disables electrical coupling between power source 160 and one or more of laser diodes 110. Generally, when a laser diode 110 draws higher electric current, the laser diode 110 outputs higher intensity laser light. Thus, the second laser safety circuit is used to disable one or more of laser diodes 110 when the current drawn thereby exceeds the second threshold because having one or more of laser diodes 110 draw current that exceeds the second threshold present a safety risk to the user.

In some implementations, the second laser safety circuit may be adapted to monitor the current drawn by each respective one of laser diodes 110 and to selectively deactivate any one or all of laser diodes 110 in response to a detected current drawn that exceeds the second threshold. Such implementations may employ, for example, a respective current sensor 151, latch 152, and switch 153 that mediate communicative coupling between power source 160 and respective ones of laser diodes 110.

Both latch 132 and 152 may be communicatively coupled to processor 170 and processor 170 may be responsive to the states of latches 132 and 152. That is, if either latch 132 or 152 is in the respective second state, processor 170 may modulate the laser diodes to output no light and may prevent any further modulations of laser light from occurring. This provides redundant safety measures if switch 133 or switch 153 fails to respond to the respective state of latch 132 or 153 correctly.

Laser projector 100 may include a laser diode driver between power source 160 and laser diodes 110 which modulates laser diodes 100. The laser diode driver may also be responsive to signals from or states of elements of the first laser safety circuit and the second laser safety circuit.

Throughout this specification and the appended claims, reference is often made to a "first threshold" for the maximum safe power/intensity of laser light and a "second threshold" for the maximum safe electrical current (i.e., maximum amperage). The first threshold may be defined based on a variety of factors including, for example, the wavelength(s) of the laser diode(s) (different wavelengths have different effects on the eye), the specific portion of light incident on the photodetector, the type of display employed, and/or the efficiency of any intervening optical elements in the optical path of the laser light between the laser diode(s) and the display/eye of the user (e.g., scan mirrors, lenses, polarizers, filters, diffractive optical elements). The second threshold may also be defined based on a number of factors including, the wavelengths(s) if the laser diode, the efficiency of the conversion of current into laser light by the laser diodes, the safety limit of amperage in a commercial device, etc. Once defined, these thresholds may advantageously be non-varying and independent of any parameters that may change during the operation of the laser projector, such as the scan rate of a scan mirror (e.g., the scan mirror function may have a discrete safety mechanism). In some implementations, the thresholds may take into account any number of failure modes and/or "worst-case scenarios" (such as a mirror failure that causes the laser spot to remain fixed in one place on the user's eye) so that any such failures or scenarios are accounted for in static, non-varying thresholds without having to introduce additional monitoring and feedback systems.

As an example, the first laser safety circuit (e.g., upstream of the latch element of the first laser safety circuit) may include a first comparator operative to compare the signal coming from the photodetector to a static threshold value defined as outlined above.

As an example, the second laser safety circuit (e.g., upstream of the latch element of the second laser safety circuit) may include a second comparator operative to compare the signal coming from the current sensor to a static threshold value defined as outlined above.

As described above, the second threshold(s) for the current(s) drawn by respective ones or collectively by all of laser diodes 110 may be non-varying for a given physical implementation of the second laser safety circuit; however, in implementations in which a second laser safety circuit is deployed in a real, manufactured product (e.g., in a consumer-ready WHUD), it may be necessary for the second threshold(s) employed to differ from one WHUD to the next. For example, in a manufacturing process that produces scanning laser projectors (or WHUDs that include scanning laser projectors), even if all the laser diodes used come from the same supplier and with tight tolerances there will be performance differences from one laser diode to the next. In some instances, the amount of current that can cause different instances of the "same" laser diode to output a dangerous amount of light can vary by around 50%. For this reason, it can be challenging to employ a second laser safety circuit having the same parameters (e.g., the same second threshold(s)) across all deployments in different ones of the same product. In order to overcome this challenge, in accordance with the present systems, devices, and methods, the second laser safety circuit may be "trimmable." That is, the second laser safety may include a mechanism that enables the second threshold(s) to be tuned or adjusted based on the performance characteristics of the particular laser diode(s) being employed. For example, a digital potentiometer or "digital trim pot" may be included in the second laser safety and used to set the second threshold(s). The current sensor (e.g., 151) and the digital potentiometer may both feed into a comparator and the comparator may compare the incoming current sensor data against a configured setting of the digital potentiometer representative of a second threshold value. The comparator may then control the state of the latch as previously described. In this implementation, the second threshold is essentially tunable via the digital potentiometer. Thus, during manufacture of the device (projector, WHUD, or the like) that employs the second laser safety circuit, the performance profile of the laser diode(s) may be determined and the digital potentiometer may be tuned to adjust the second threshold(s) to the appropriate safe level(s) that corresponds to the particular laser diode(s) being employed.

The first threshold value for the power of laser light received by photodetector 131 may be calculated based on the maximum amount of light that can be safely received by an eye of a user and the percentage of attenuation of light through any intervening optical elements of the laser projector along the optical path between the laser diode(s) and the eye of the user. For example, the path of light from the laser diode(s) to the eye may be through the beam splitter, scanned over two scan mirrors, and redirected from a holographic optical element to the retina of the eye. In this example, if the maximum amount of light safely receivable by the eye is 1 mW, the holographic optical element has 30% loss of light, the two scan mirrors each lose 5% of the light, and the beam splitter directs 25% of the light to the photodetector, then the maximum power/intensity of light that can be received by the photodetector without exceeding 1 mW at the eye is $$0.52 \text{ mW} \left( \text{i.e., } 0.25 \times \frac{1}{(0.7 \times 0.95 \times 0.95 \times 0.75)} \text{mW}. \right.$$

Thus, in this example the threshold value may be set at 0.52 mW and the first laser safety circuit may be configured to operate in the first configuration (in which the switch is closed and electrical power is coupled to the laser diodes) when the signal provided by the photodetector corresponds to less than 0.52 mW detected by the photodetector and in the second configuration (in which the switch is open and the laser diodes are cut-off from the power source) when the signal provided by the photodetector corresponds to greater than 0.52 mW detected by the photodetector. As a further protective measure, the threshold may be lowered to account for various failures modes, such as lowering the threshold by (e.g., 5%, 10%, 25%, 50%, depending on the specific implementation) to ensure the laser light received by the eye will be safe even in the event of such a failure (e.g., in the event of a mirror disruption that causes the laser light to stop sweeping and instead project onto a single point at the user's eye).

Figure 2A:
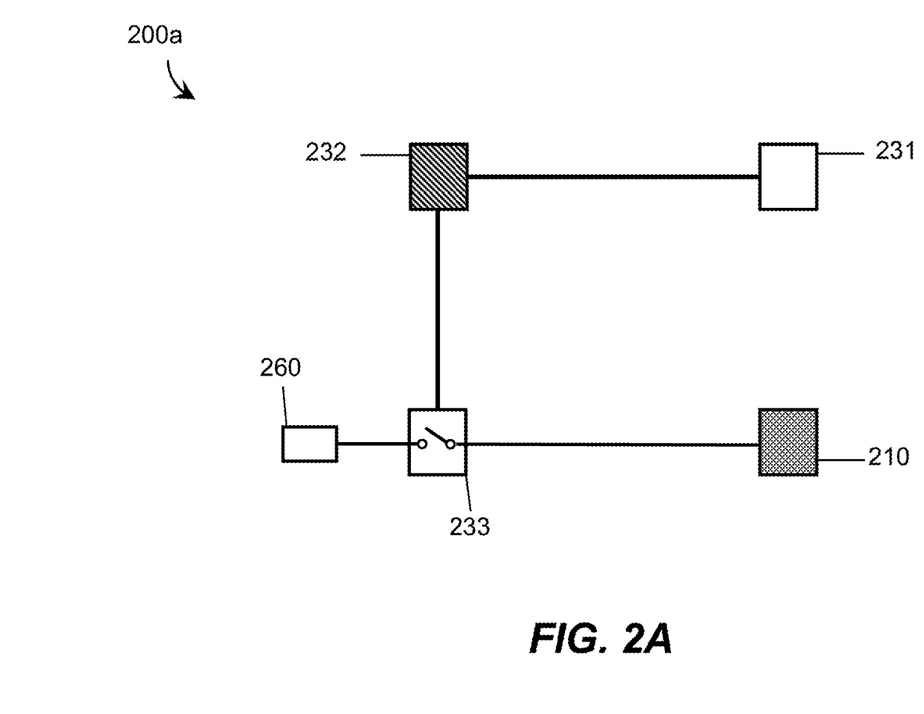
FIG. 2A is a schematic diagram of a first laser safety circuit for a laser projector, the laser safety circuit shown in a configuration in which the at least one laser diode of the projector is electrically uncoupled from the power source in accordance with the present systems, devices, and methods.
Figure 2B:
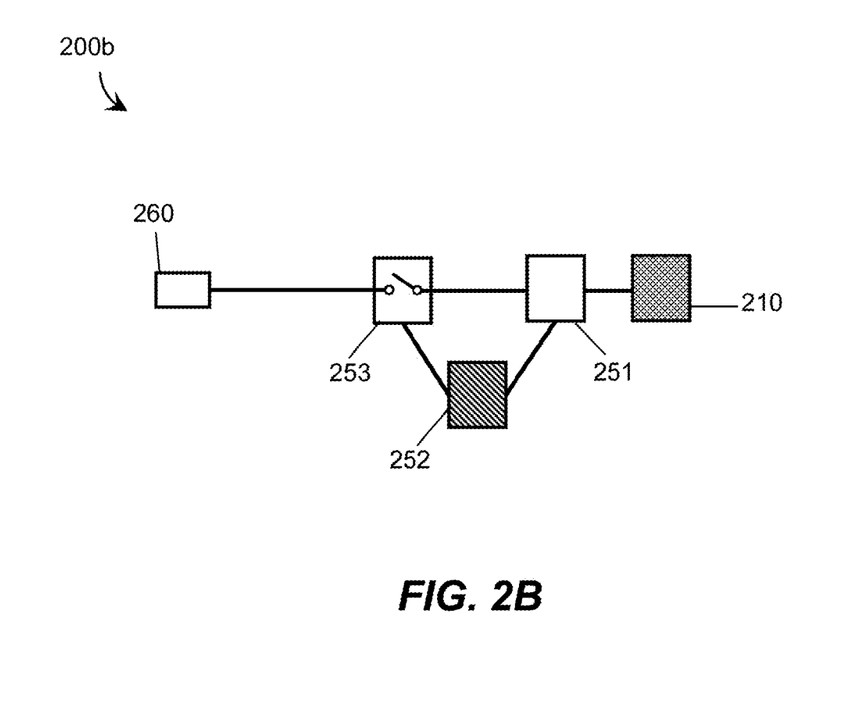
FIG. 2B is a schematic diagram of a second laser safety circuit for a laser projector, shown in a configuration in which the at least one laser diode of the projector is electrically uncoupled from the power source in accordance with the present systems, devices, and methods.

In FIG. 1, switches 132 and 152 are shown in an exemplary closed configuration indicating electrical coupling of laser diodes 110 and power source 160, thereby enabling the continued generation of first portion 115 and second portion 116 of aggregate laser light. FIGS. 2A and 2B provide illustrative examples of the "switch open" configurations of the first laser safety circuit and second laser safety circuit, respectively.

FIG. 2A is a schematic diagram of a first laser safety circuit 200a for a laser projector, the laser safety circuit shown in a configuration in which the at least one laser diode 210 of the projector is electrically uncoupled from a power source 260 in accordance with the present systems, devices, and methods. In the illustrated example of FIG. 2A, photodetector 231 detects a laser light signal above the first threshold, and consequently outputs an above first threshold signal. Latch 232 has received an above first threshold signal from photodetector 231 and entered into the second state or configuration (represented by shading of latch 232 in FIG. 2A). Switch 233 has responded to the second state or configuration of latch 232 and has opened to disable electrical coupling between the at least one laser diode 210 and power source 260. The at least one laser diode 210 is without power (represented by shading of at least one laser diode 210) and cannot emit a laser light signal. The latch may be operable to store the current state and maintain the state during and after a reboot event. In the circumstances and configuration of FIG. 2B, the latch would still be in the second state following a reboot event unless the latch is positively cleared, via a separate action by the user that is not part of an automated or autonomous process of rebooting. Electrical coupling of the power source and laser diodes would remain interrupted.

FIG. 2B is a schematic diagram of a first laser safety circuit 200b for a laser projector, the laser safety circuit shown in a configuration in which the at least one laser diode 210 of the projector is electrically uncoupled from the power source 260 in accordance with the present systems, devices, and methods. In the illustrated example of FIG. 2B, current sensor 251 detects an electrical current output from power source 260 above the second threshold, and consequently outputs an above second threshold signal. Latch 252 has received an above second threshold signal from current sensor 251 and entered into the second state or configuration (represented by shading of latch 252 in FIG. 2B). Switch 253 has responded to the second state or configuration of latch 252 and has opened to disable electrical coupling between the at least one laser diode 210 and power source 260. The at least one laser diode 210 is without power (represented by shading of at least one laser diode 210) and cannot emit a laser light signal. The latch may be operable to store the current state and maintain the state during and after a reboot event. In the circumstances and configuration of FIG. 2B, the latch would still be in the second state following a reboot event unless the latch is positively cleared, via a separate action by the user that is not part of an automated or autonomous process of rebooting. Electrical coupling of the power source and laser diodes would remain interrupted.

Figure 3A:
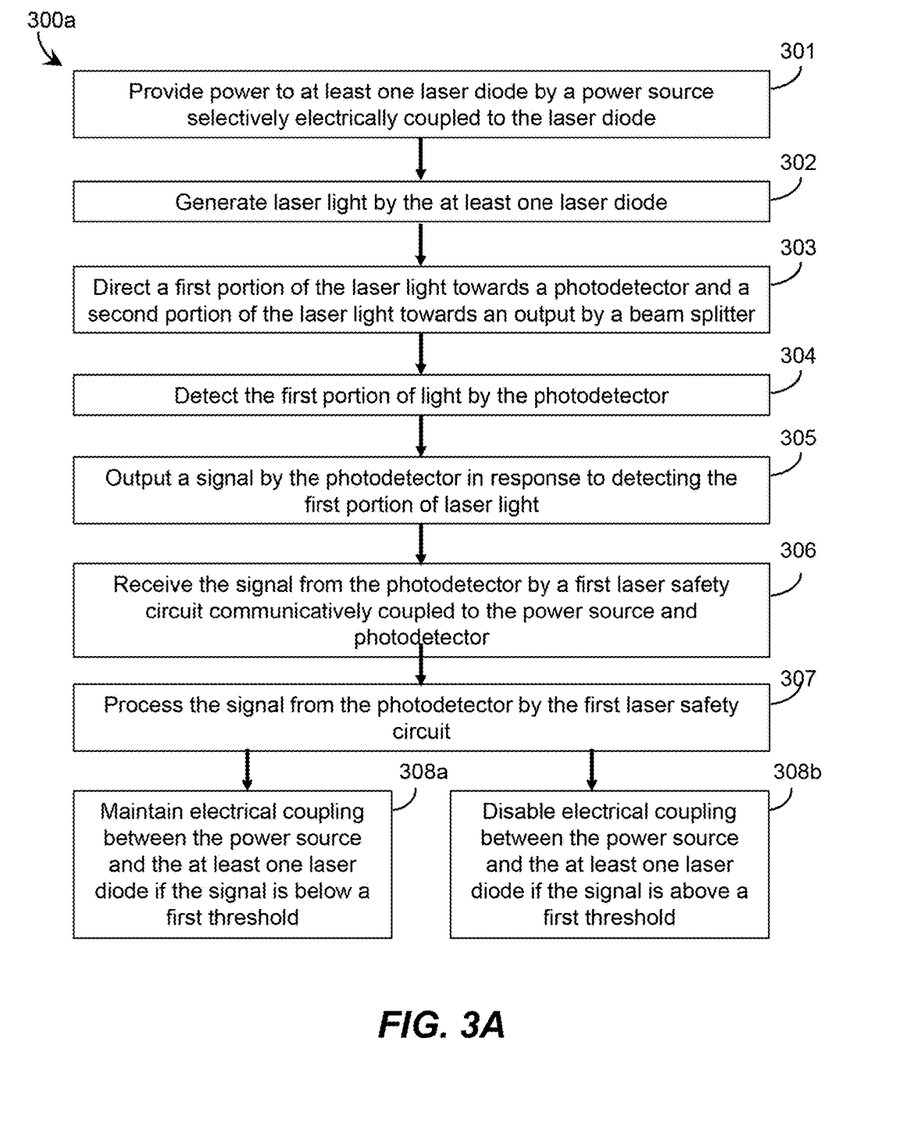
FIG. 3A is a flow diagram showing a method of operating a laser projector with a first laser safety circuit in accordance with the present systems, devices, and methods.

FIG. 3A is a flow diagram showing a method 300a of operating a laser projector with a first laser safety circuit in accordance with the present systems, devices, and methods. The laser projector may be substantially similar, or even identical, to the laser projector 100 from FIG. 1 and the first laser safety circuit may be substantially similar, or even identical, to that used in laser projector 100 and/or first laser safety circuit 200a from FIG. 2A. The laser projector generally includes a power source, at least one laser diode, a photodetector, and a first laser safety circuit communicatively coupled between the photodetector and the power source. Method 300a comprises various acts 301, 302, 303, 304, 305, 306, 307, and 308a/b, though those of skill in the art will appreciate that in alternative embodiments certain acts may be omitted and/or additional acts may be added. Method 300a may occur simultaneously with method 300b described below and shown in FIG. 3B, but is described separately for clarity. Those of skill in the art will also appreciate that the illustrated order of the acts is shown for exemplary purposes only and may change in alternative embodiments.

At 301, the power source provides power to the at least one laser diode. The power source may be selectively electrically coupled through a switch to the at least one laser diode, the switch being part of the first laser safety circuit and operative to allow or disable power to the at least one laser diode. At 301, the switch is "closed" to enable coupling of electrical power therethrough from the power source to the laser diode(s).

At 302, the at least one laser diode generates laser light using the electrical power received from the power source.

At 303, a beam splitter directs a first portion of the laser light towards a photodetector and a second portion of the laser light towards an output of the projector. Those of skill in the art will appreciate that the path of the laser light from the laser diode(s) to beam splitter may contain several optical elements (i.e., optics) that reflect, transmit, shape, and/or combine the light. In some implementations the beam splitter may also act as a combiner of different laser light beams generated at 302 (as illustrated in the example of FIG. 1). The light output by the projector may be directed towards a scan mirror or other element(s) that directs the light to illuminate an area. The area may be a field of view of a user for display purposes or may be an eye of a user for eye tracking purposes.

At 304, the photodetector detects the first portion of light directed from the beam splitter at 303. The photodetector is responsive to all of the wavelengths of light included in the laser light generated by the at least one laser diode at 302. An example of a suitable photodetector having such wide optical spectral sensitivity in the ISL58344 Quad Segment Photo Sensor IC from Intersil.

At 305, the photodetector outputs a signal in response to detecting the first portion of light from the beam splitter at 304. The photodetector detects the power (e.g., wattage) and/or intensity of the laser light and outputs a voltage signal representative of the power and/or intensity. Generally, the voltage of the signal output by the photodetector is dependent on (e.g., proportional to) the power and/or intensity of the laser light detected by the photodetector at 304. The signal from the photodetector may be amplified by one or more amplifier(s) and/or converted from analog to digital by one or more analog-to-digital converter(s).

At 306, the first laser safety circuit receives the signal from the photodetector. The first laser safety circuit includes communicative coupling between the photodetector and the power source and may comprise a latch or "flip-flop" communicatively coupled to the photodetector with a state/configuration responsive to the signal from the photodetector, and a switch communicatively coupled to the latch and responsive to the state/configuration of the latch.

At 307, the first laser safety circuit processes the signal from the photodetector. If, at 304, the photodetector detects a first portion of laser light that is below a maximum safe power level, then at 307 the first laser safety circuit determines that the signal from the photodetector (output at 305) is below a first threshold value. On the other hand, if, at 304, the photodetector detects a first portion of laser light that is at or above the maximum safe power level, then at 307 the first laser safety circuit determines that the signal from the photodetector (output at 305) is above the first threshold value.

From act 307, method 300a proceeds either to act 308a or act 308b depending on the magnitude of the signal provided, at 305, by the photodetector relative to the first threshold. In response to the signal received from the photodetector by the first laser safety circuit at 306 being below a first threshold (e.g., in response to the first laser safety circuit determining at 307 that the signal received from the photodetector is below the first threshold), method 300a proceeds to act 308a; whereas in response to the signal received from the photodetector by the first laser safety circuit at 306 being at or above the first threshold (e.g., in response to the first laser safety circuit determining at 307 that the signal received from the photodetector is above the first threshold), method 300a proceeds to act 308b.

At 308a, the first laser safety circuit maintains electrical coupling between the power source and the at least one laser diode in response to the signal received from the photodetector at 306 being below the first threshold. In an implementation with a latch communicatively coupled to the photodetector and a switch communicatively coupled to the latch and selectively electrically coupled between the power source and the at least one laser diode, at 308a the switch remains closed, maintaining electrical coupling between the power source and the at least one laser diode.

Alternatively, at 308b, the first laser safety circuit disables electrical coupling between the power source and the at least one laser diode in response to the signal received from the photodetector at 306 being at or above the first threshold. In an implementation with a latch communicatively coupled to the photodetector and a switch communicatively coupled to the latch and selectively electrically coupled between the power source and the at least one laser diode, at 308b the switch opens to disable electrical coupling between the power source and the at least one laser diode and effectively switches off the at least one laser diode.

In an implementation with a latch, the method may comprise additional acts. These additional acts may include: storing a current state of the latch, and maintaining the state of the latch during and following a reboot event. Following 308a, the latch would be in a first state and electrical coupling between the power source and the at least one laser diode would be intact. Following 308b, the latch would be in a second state and electrical coupling between the power source and the at least one laser diode would be interrupted. The current state of the latch is maintained (i.e., kept or reloaded) during and following a reboot event until and unless the latch is positively cleared, via a separate action by the user that is not part of an automated or autonomous process of rebooting. If the latch were in a first state before a reboot event, the latch would remain in the first state following reboot of the laser projector, and the electrical coupling between the power source and the at least one laser diode would remain intact. Likewise, if the latch were in a second state before a reboot event, the latch would remain in the second state following reboot of the laser projector, and the electrical coupling between the power source and the at least one laser diode would remain interrupted.

Figure 3B:
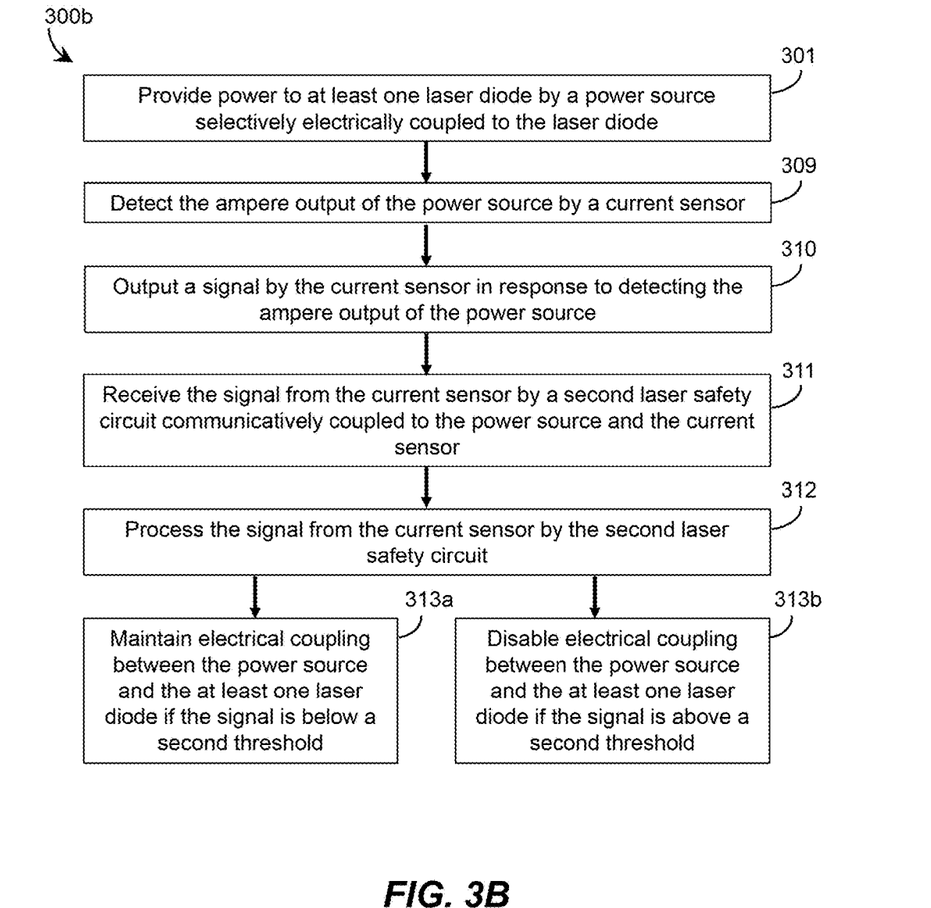
FIG. 3B is a flow diagram showing a method of operating a laser projector with a second laser safety circuit in accordance with the present systems, devices, and methods.

FIG. 3B is a flow diagram showing a method 300b of operating a laser projector with a second laser safety circuit in accordance with the present systems, devices, and methods. The laser projector may be substantially similar, or even identical, to laser projector 100 from FIG. 1 and the second laser safety circuit may be substantially similar, or even identical, to that used in laser projector 100 and/or second laser safety circuit 200b from FIG. 2B. The laser projector generally includes a power source, at least one laser diode, a current sensor, and a second laser safety circuit communicatively coupled between the current sensor and the power source. Method 300b comprises various acts 301, 309, 310, 311, 312, 313a, and 313b, though those of skill in the art will appreciate that in alternative embodiments certain acts may be omitted and/or additional acts may be added. Method 300b may occur simultaneously with method 300a described above and shown in FIG. 3A, but is described separately for clarity. Those of skill in the art will also appreciate that the illustrated order of the acts is shown for exemplary purposes only and may change in alternative embodiments.

At 301, the power source provides power to the at least one laser diode. The power source may be selectively electrically coupled through a switch to the at least one laser diode, the switch being part of the second laser safety circuit and operative to allow or disable power to the at least one laser diode. At 301, the switch is "closed" to enable coupling of electrical power therethrough from the power source to the laser diode(s).

At 309, the current sensor detects the electrical current output by the power source.

At 310, the current sensor outputs a signal in response to detecting the electrical current. The current sensor detects the magnitude of the current (i.e., value of the amperes output by the power source). The signal output by the current sensor is indicative of the electrical current output by the power source.

At 311, the second laser safety circuit receives the signal from the current sensor. The second laser safety circuit includes communicative coupling between the current sensor and the power source and may comprise a latch or "flip-flop" communicatively coupled to the current sensor with a state/configuration responsive to the signal from the current sensor, and a switch communicatively coupled to the latch and responsive to the state/configuration of the latch.

At 312, the second laser safety circuit processes the signal from the photodetector. If, at 309, the current sensor detects an electrical current below a maximum safe current level, then at 312 the second laser safety circuit determines that the signal from the current sensor is below a second threshold value. On the other hand, if, at 309, the current sensor detects an electrical current that is at or above the maximum safe current level, then at 312 the second laser safety circuit determines that the signal from the current sensor is above the second threshold value.

From act 312, method 300b proceeds either to act 313a or act 313b depending on the magnitude of the signal provided by the current sensor relative to the second threshold. In response to the signal received from the current sensor by the second laser safety circuit being below a second threshold (e.g., in response to the second laser safety circuit determining at 312 that the signal received from the photodetector is below the second threshold), method 300b proceeds to act 313a; whereas in response to the signal received from the current sensor by the second laser safety circuit being at or above the second threshold (e.g., in response to the second laser safety circuit determining at 312 that the signal received from the photodetector is above the second threshold), method 300b proceeds to act 313b.

At 313a, the second laser safety circuit maintains electrical coupling between the power source and the at least one laser diode in response to the signal received from the current at 311 being below the second threshold. In an implementation with a latch communicatively coupled to the current sensor and a switch communicatively coupled to the latch and selectively electrically coupled between the power source and the at least one laser diode, at 313a the switch remains closed, maintaining electrical coupling between the power source and the at least one laser diode.

Alternatively, at 313b, the second laser safety circuit disables electrical coupling between the power source and the at least one laser diode in response to the signal received from the current sensor at 311 being at or above the second threshold. In an implementation with a latch communicatively coupled to the current sensor and a switch communicatively coupled to the latch and selectively electrically coupled between the power source and the at least one laser diode, at 313b the switch opens to disable electrical coupling between the power source and the at least one laser diode and effectively switches off the at least one laser diode.

In some implementations, the laser projector may further include a digital potentiometer and method 300b may include setting the second threshold by the digital potentiometer. In such implementations, processing the signal from the current sensor at 312 may include comparing, e.g., by a comparator communicatively coupled to the digital potentiometer and communicatively coupled in between the current sensor and the latch, the signal from the current sensor to the second threshold value set by the digital potentiometer.

In an implementation with a latch, the method may comprise additional acts. These additional acts may include: storing a current state of the latch, and maintaining the state of the latch during and following a reboot event. Following 313a, the latch would be in a first state and electrical coupling between the power source and the at least one laser diode would be intact. Following 313b, the latch would be in a second state and electrical coupling between the power source and the at least one laser diode would be interrupted. The current state of the latch is maintained (i.e., kept or reloaded) during and following a reboot event until and unless the latch is positively cleared, via a separate action by the user that is not part of an automated or autonomous process of rebooting. If the latch were in a first state before a reboot event, the latch would remain in the first state following reboot of the laser projector, and the electrical coupling between the power source and the at least one laser diode would remain intact. Likewise, if the latch were in a second state before a reboot event, the latch would remain in the second state following reboot of the laser projector, and the electrical coupling between the power source and the at least one laser diode would remain interrupted.

For both method 300a and method 300b the laser projector may further include one or more processor(s) communicatively coupled to both the first laser safety circuit and the second laser safety circuit by the respective latches, and one or more non-transitory processor-readable storage medium (or media) communicatively coupled to the processor(s). The processor(s) may be responsive to the state of the first latch and the second latch and the method may further include wherein the processor(s) modulates the laser diodes to stop outputting laser light when either or both latches are in the respective second states/configurations. A flag may be stored in non-transitory processor-readable storage medium (or media) by the processor(s) when either or both latches are in the second state/configuration that prevents modulation of the laser diodes by the processor(s) following a reboot event.

As previously described, the laser projector safety systems, devices, and methods described herein are particularly well-suited for use in WHUDs. An illustrative example of a WHUD that employs a laser projector with a first laser safety circuit and a second laser safety circuit is provided in FIG. 4.

Figure 4:
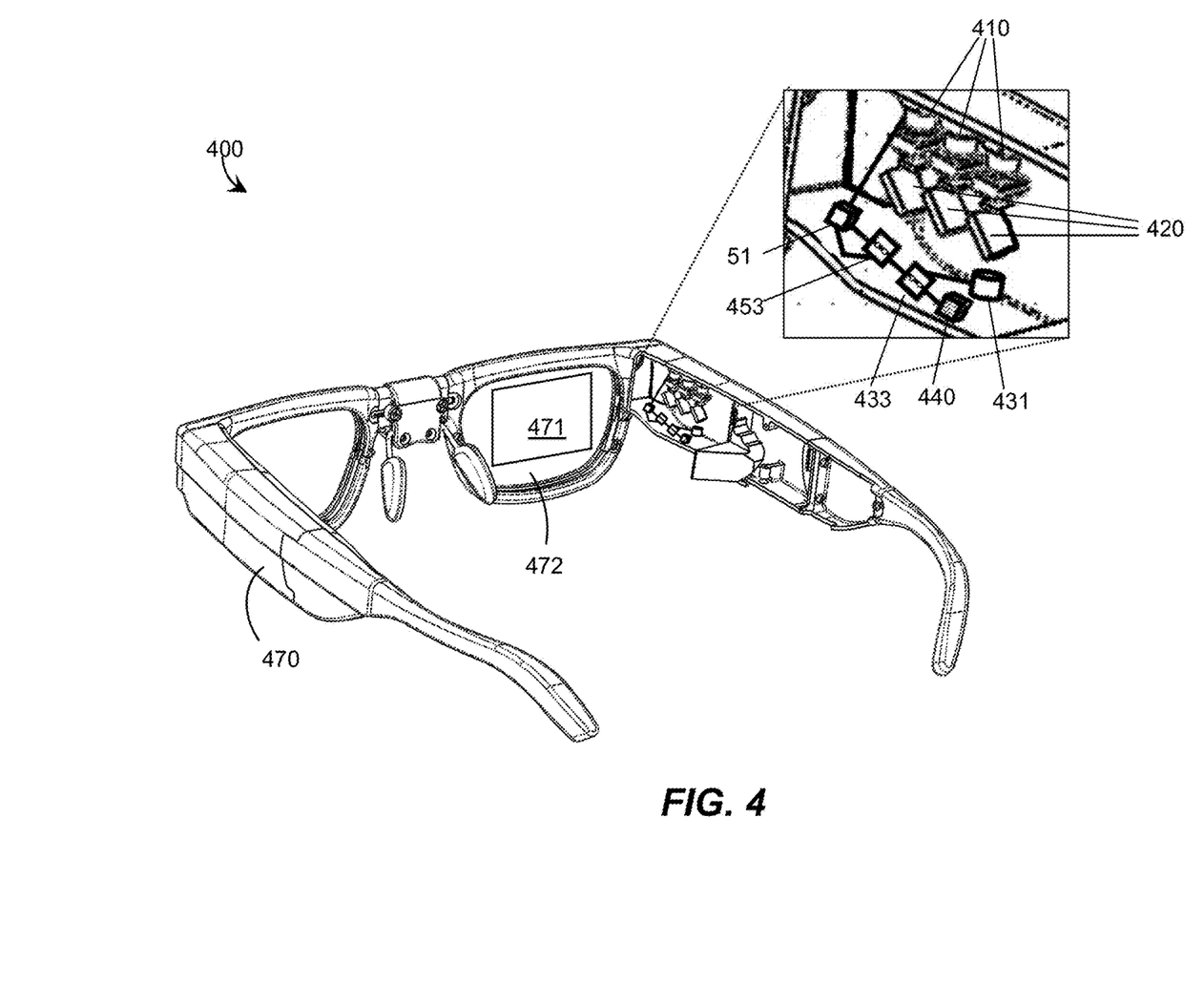
FIG. 4 is partial cutaway perspective view of a wearable heads-up display with a laser projector and associated first laser safety circuit and second laser safety circuit in accordance with the present systems, devices, and methods.

FIG. 4 is partial cutaway perspective view of a WHUD 400 with a laser projector 430 and associated first and second laser safety circuits in accordance with the present systems, devices, and methods. WHUD 400 includes a support structure 470 that in use is worn on the head of a user and has a general shape and appearance of an eyeglasses frame. Support structure 470 carries multiple components, including: a lens 471, a transparent combiner 472, and a laser projector. The laser projector (see magnified view thereof in box) is generally similar, or even identical, to laser projector 100 from FIG. 1 and includes laser diodes 410 a beam combiner/splitter 420, a laser diode power source 460 selectively electrically coupleable to laser diodes 410, a processor (not shown) to modulate emission of light from laser diodes 410, a photodetector 431, a current sensor 451, a first laser safety circuit, and a second laser safety circuit. The first laser safety circuit includes a switch 433 electrically coupled between laser diodes 410 and power source 460, as well as a first latch (not shown to reduce clutter) communicatively coupled to and between photodetector 431 and switch 433. The second laser safety circuit includes a switch 453 electrically coupled between laser diodes 110 and power source 460, as well as a second latch (not shown to reduce clutter) communicatively coupled to and between current sensor 451 and switch 453. The laser projector operates in generally the same manner as laser projectors 100 from FIG. 1, the first and second laser safety circuits operate in generally the same manner as the respective first and second laser safety circuits in FIGS. 1, 2A, and 2B. Laser diodes 410 output laser light to beam combiner 420. Beam combiner 420 combines the laser light from laser diodes 410 into a single aggregate beam. A first portion of the aggregate beam light is directed towards photodetector 431 and a second portion of the aggregate light is directed to an output of the laser projector. Output aggregate laser light may be directed towards a scan mirror to create an image in the field of view of the user.

The first laser safety circuit operates as follows. Photodetector 431 detects the first portion of aggregate light from the beam splitter and outputs a signal based on the power of the light. The first latch has a state/configuration that is responsive to the signal from photodetector 431. The first latch remains in a first state/configuration if the signal from photodetector 431 is below a first threshold and changes to a second state/configuration if the signal from photodetector 431 is at or above a first threshold. The first latch may be operable to store the current state during a reboot event and maintain (i.e., keep or reload) the state after the reboot event until and unless the latch is positively cleared, via a separate action by the user that is not part of an automated or autonomous process of rebooting. Switch 433 is communicatively coupled to and responsive to the state/configuration of the first latch. Switch 433 is selectively, electrically coupleable between power source 460 and laser diodes 410 and can enable or disable electrical coupling between power source 460 and laser diodes 410, in response to the state/configuration of the first latch.

The second laser safety circuit operates as follows. Current sensor 451 detects the magnitude (i.e., the amperage) of the electric current output from power source 460 and outputs a signal indicative of the electric current. The second latch, which has a state/configuration that is responsive to the signal from current sensor 451, receives the signal from current sensor 451. The second latch remains in a first state/configuration if the signal from current sensor 451 is below a second threshold and changes to a second state/configuration if the signal from current sensor 451 is at or above a second threshold. The second latch may be operable to store the current state during a reboot event and maintain (i.e., keep or reload) the state after the reboot event until and unless the second latch is positively cleared, via a separate action by the user that is not part of an automated or autonomous process of rebooting. Switch 453 is communicatively coupled to and responsive to the state/configuration of the second latch. Switch 453 is selectively, electrically coupleable between power source 460 and laser diodes 410 and can enable or disable electrical coupling between power source 460 and laser diodes 410, in response to the state/configuration of the second latch.

Both the first latch and the second latch may be communicatively coupled to the processor and the processor may be responsive to the state of both latches. That is, if either latch is in the respective second state, the processor will respond by modulating laser diodes 410 to produce no laser light and will not perform any further modulation of laser light. WHUD 400 may further include a non-transitory processor-readable storage medium which is communicatively coupled to the processor, and which stores processor executable data and/or instructions. In response to the first or second latch being in a respective second state/configuration the processor may store a flag in the non-transitory processor-readable storage medium which, upon a reboot event, prevents the processor from modulating the output of light from laser diodes 410.

In some implementations, at least a first processor may be communicatively coupled to a first set of components (e.g., laser diodes 410, the at least one scan mirror, other functionality components of WHUD 400) for the purpose of controlling operation of the first set of components and at least a second processor (e.g., a microcontroller) may be communicatively coupled to the elements (e.g., current sensor 151, latch 152) of the second laser safety circuit for the purpose of controlling operation of the elements of the second laser safety circuit.

Throughout this specification and the appended claims, the term "carries" and variants such as carried by are generally used to refer to a physical coupling between two objects. The physical coupling may be direct physical coupling (i.e., with direct physical contact between the two objects) or indirect physical coupling mediated by one or more additional objects. Thus the term carries and variants such as "carried by" are meant to generally encompass all manner of direct and indirect physical coupling.

A person of skill in the art will appreciate that the various embodiments for laser projectors described herein may be applied in non-WHUD applications. For example, the present systems, devices, and methods may be applied in non-WHUD and/or in other applications that may or may not include a visible display.

In some implementations, one or more optical fiber(s) may be used to guide light signals along some of the paths illustrated herein.

The WHUDs described herein may include one or more sensor(s) (e.g., microphone, camera, thermometer, compass, altimeter, and/or others) for collecting data from the user's environment. For example, one or more camera(s) may be used to provide feedback to the processor of the WHUD and influence where on the display(s) any given image should be displayed.

The WHUDs described herein may include one or more on-board power sources (e.g., one or more battery(ies)), a wireless transceiver for sending/receiving wireless communications, and/or a tethered connector port for coupling to a computer and/or charging the one or more on-board power source(s).

The WHUDs described herein may receive and respond to commands from the user in one or more of a variety of ways, including without limitation: voice commands through a microphone; touch commands through buttons, switches, or a touch sensitive surface; and/or gesture-based commands through gesture detection systems as described in, for example, U.S. Non-Provisional patent application Ser. Nos.

14/155,087, 14/155,107, PCT Patent Application PCT/US2014/057029, and/or U.S. Provisional Patent Application Ser. No. 62/236,060, all of which are incorporated by reference herein in their entirety.

Throughout this specification and the appended claims, infinitive verb forms are often used. Examples include, without limitation: "to detect," "to provide," "to transmit," "to communicate," "to process," "to route," and the like. Unless the specific context requires otherwise, such infinitive verb forms are used in an open, inclusive sense, that is as "to, at least, detect," to, at least, provide," "to, at least, transmit," and so on.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet which are owned by Thalmic Labs Inc., including but not limited to: US Patent Application Publication No. 2016-0377866 A1 US, US Patent Application Publication No. 2016-0377865, US Patent Application Publication No. US 2014-0198034 A1, US Patent Application Publication No. US 2016-0238845 A1, US Patent Application Publication No. US 2014-0198035 A1, Non-Provisional patent application Ser. Nos. 15/046,234, 15/046,254, 15/145,576, 15/145,609, 15/147,638, 15/145,583, 15/256, 148, 15/167,458, 15/167,472, 15/167,484, 15/381,883, 15/331,204, 15/282,535, U.S. Provisional Patent Application Ser. No. 62/271,135 U.S. Provisional Patent Application Ser. No. 62/268,892, U.S. Provisional Patent Application Ser. No. 62/322,128, U.S. Provisional Patent Application Ser. No. 62/420,368, U.S. Provisional Patent Application Ser. No. 62/420,371, U.S. Provisional Patent Application Ser. No. 62/420,380, U.S. Provisional Patent Application Ser. No. 62/438,725, U.S. Provisional Patent Application Ser. No. 62/374,181, U.S. Provisional Patent Application Ser. No. 62/482,062, U.S. Provisional Patent Application Ser. No. 62/557,551, U.S. Provisional Patent Application Ser. No. 62/557,554, U.S. Provisional Patent Application Ser. No. 62/565,677, U.S. Provisional Patent Application Ser. No. 62/573,978, and U.S. Provisional Patent Application Ser. No. 62/537,737 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A wearable heads-up display ("WHUD") comprising:
a support structure that in use is worn on the head of a user;
a transparent combiner carried by the support structure and positioned in a field of view of at least one eye of the user when the support structure is worn on the head of the user; and a laser projector carried by the support structure and positioned and oriented to direct laser light towards the transparent combiner, the laser projector comprising:
  at least one laser diode;
  a power source;
  a photodetector responsive to laser light output by the at least one laser diode;
  a current sensor responsive to electric current output by the power source;
  a beam splitter positioned and oriented to direct a first portion of laser light from the at least one laser diode along a first optical path towards the photodetector and a second portion of laser light from the at least one laser diode along a second optical path towards an output of the laser projector;
  a first laser safety circuit communicatively coupled to the photodetector and responsive to signals therefrom, the first laser safety circuit comprising a first switch that mediates an electrical coupling between the power source and the at least one laser diode, wherein in response to a signal from the photodetector indicative that a power of the laser light output by the at least one laser diode exceeds a first threshold, the first switch interrupts a supply of power to the at least one laser diode from the power source;
  a second laser safety circuit communicatively coupled to the current sensor and responsive to signals therefrom, the second laser safety circuit comprising a second switch that mediates an electrical coupling between the power source and the at least one laser diode, wherein, in response to a signal from the current sensor indicative that an electric current output of the power source exceeds a second threshold, the second switch interrupts a supply of power to the at least one laser diode from the power source;
  a processor communicatively coupled to the at least one laser diode and to both the first laser safety circuit and the second laser safety circuit, the processor to modulate the at least one laser diode; and
  a non-transitory processor-readable storage medium communicatively coupled to the processor, wherein, in response to either a signal from the photodetector indicative that a power of the laser light output by the at least one laser diode exceeds a first threshold or a signal from the current sensor indicative that an electric current output by the power source exceeds a second threshold:
    the processor stops modulating the at least one laser diode;
    the processor stores a flag in the non-transitory processor-readable storage medium; and
    upon boot-up of the laser projector, the processor accesses the non-transitory processor-readable storage medium to check for the flag, wherein in response to the processor finding the flag stored in the non-transitory processor-readable storage medium the processor prevents modulations of the at least one laser diode.

2. The WHUD of claim 1 wherein the first laser safety circuit of the laser projector further comprises a first latch that is communicatively coupled to the photodetector and to the first switch, wherein:
  a state of the first latch is responsive to signals from the photodetector and the first switch is responsive to the state of the first latch;
  the state of the first latch changes from a first state to a second state in response to the signal from the photodetector indicative that the power of the laser light output by the at least one laser diode exceeds the first threshold; and
  the first switch interrupts the supply of power to the at least one laser diode in response to the state of the first latch changing from the first state to the second state.

3. The WHUD of claim 2 wherein the first latch is operable to store a current state selected from the first state and the second state and maintain the current state during a reboot event.

4. The WHUD of claim 2 wherein the processor is communicatively coupled to the first latch, and wherein, in response to the first latch being in the second state, the processor stops modulating the at least one laser diode and prevents further modulations of the at least one laser diode.

5. The WHUD of claim 4 wherein in response to the first latch being in the second state, the processor stores a flag in the non-transitory processor-readable storage medium.

6. The WHUD of claim 1 wherein the second laser safety circuit further includes a second latch that is communicatively coupled to the current sensor and to the second switch, and wherein:
  a state of the second latch is responsive to signals from the current sensor and the second switch is responsive to the state of the second latch;
  the state of the second latch changes from a first state to a second state in response to the signal from the current sensor indicative that the electric current output by the power source exceeds the second threshold; and
  the second switch interrupts the supply of power to the at least one laser diode from the power source in response to the state of the second latch changing from the first state to the second state.

7. The WHUD of claim 6 wherein the second latch is operable to store a current state selected from the first state and the second state and maintain the current state during a reboot event.

8. The WHUD of claim 6 wherein the processor is communicatively coupled to the second latch, and wherein, in response to the second latch being in the second state, the processor stops modulating the at least one laser diode and prevents further modulations of the at least one laser diode.

9. The WHUD of claim 8 wherein in response to second latch being in the second state the processor stores a flag in the non-transitory processor-readable storage medium.

10. The WHUD of claim 6, further comprising:
  a digital potentiometer to set the second threshold; and
  a comparator communicatively coupled to the digital potentiometer and communicatively coupled in between the current sensor and the second latch, the comparator to compare signals from the current sensor to the second threshold set by the digital potentiometer and to control the state of the latch based on a comparison between at least one signal from the current sensor and the second threshold set by the digital potentiometer.

11. The WHUD of claim 1 wherein the second laser safety circuit further includes a digital potentiometer to set the second threshold.

* * * * *